US012811580B2

(12) United States Patent
Tan et al.

(10) Patent No.: US 12,811,580 B2
(45) Date of Patent: Nov. 24, 2026

(54) PASSGATE SWITCH GATE-DRIVER CONTROL FOR PREVENTING NO-OVERSHOOT WHEN SWITCHING

(71) Applicant: NEXPERIA B.V, Nijmegen (NL)

(72) Inventors: Gim Heng Tan, Penang (MY); Jiu Soon Tan, Penang (MY); Gabriel Sing Leung Chong, Penang (MY)

(73) Assignee: Nexperia B.V., Nijmegen (NL)

( * ) Notice: Subject to any disclaimer, the term of this patent is extended or adjusted under 35 U.S.C. 154(b) by 13 days.

(21) Appl. No.: 19/027,414

(22) Filed: Jan. 17, 2025

(65) Prior Publication Data

US 2025/0240008 A1 Jul. 24, 2025

(30) Foreign Application Priority Data

Jan. 19, 2024 (EP) .................................... 24152953

(51) Int. Cl.
*H03K 17/082* (2006.01)

(52) U.S. Cl.
CPC . *H03K 17/0822* (2013.01); *H03K 2217/0054* (2013.01)

(58) Field of Classification Search
CPC .................................................. H03K 17/0822
USPC ........................................................ 327/379
See application file for complete search history.

(56) References Cited

U.S. PATENT DOCUMENTS

| | | | | |
|---|---|---|---|---|
| 8,624,663 | B2 | 1/2014 | Gagne et al. | |
| 11,489,519 | B2 | 11/2022 | Schmidt et al. | |
| 2002/0084803 | A1 * | 7/2002 | Mathew ............... | H03K 17/063 326/113 |

OTHER PUBLICATIONS

Extended European search report for corresponding European patent application EP24152953.6, 8 pages, dated Jun. 21, 2024.

* cited by examiner

*Primary Examiner* — Tomi Skibinski
(74) *Attorney, Agent, or Firm* — Ruggiero McAllister & McMahon LLC

(57) ABSTRACT

A Passgate Gate-Driver Control system is provided, including a Gate-Driver Control and a passgate switch. The passgate switch includes a P-channel Metal-Oxide-Semiconductor (PMOS), transistor and an N-channel Metal-Oxide-Semiconductor (NMOS), transistor. The Gate-Driver Control includes a Pass Gate Charge-Injector arranged to alter a charging speed and/or a discharging speed of an electrical charge at a gate of the PMOS and/or NMOS transistor.

17 Claims, 8 Drawing Sheets

PASSGATE SWITCH GATE-DRIVER CONTROL FOR PREVENTING NO-OVERSHOOT WHEN SWITCHING

CROSS-REFERENCE TO RELATED APPLICATIONS

This application claims the benefit under 35 U.S.C. § 119 (a) of European Patent Application No. 24152953.6 filed Jan. 19, 2024, the contents of which are incorporated by reference herein in their entirety.

BACKGROUND

1. Field of the Disclosure

The present disclosure relates to a Passgate Gate-Driver Control system, a Gate-Driver Control for such Passgate Gate-Driver Control system, a Pass Gate Charge-Injector for such Gate-Driver Control and an Input Voltage Sensing Timer for such Passgate Gate-Driver Control system.

2. Description of the Related Art

Passgate switches are components in digital circuitry used for switching signals or controlling the flow of data within a circuit. They play a role in integrated circuits, especially in Complementary Metal-Oxide-Semiconductor CMOS technology. Passgate switches typically include two transistors, one P-channel Metal-Oxide-Semiconductor (PMOS) and one N-channel Metal-Oxide-Semiconductor (NMOS), that work together to form a transmission gate. The PMOS transistor may operate as a switch when the input signal at the gate terminal of the PMOS transistor is at a low voltage level (logic 0), while the NMOS transistor may function as a switch when the input signal at the gate of the NMOS transistor is at a high voltage level (logic 1). When the control signals (i.e., input signals) of these transistors are appropriately manipulated, the passgate switch allows signals to pass through or be blocked, essentially acting as an on/off switch for the flow of data or electrical signals.

Passgate switches are used in various digital circuit applications, such as multiplexers, logic gates, flip-flops, and more complex circuits. They enable efficient routing of signals, data transmission, and manipulation within these circuits, contributing to the overall functionality and operation of electronic devices.

Overshoot and Undershoot voltage during switching passgate switches can damage system due to overvoltage stresses. External Resistor-Inductor-Capacitive (RLC) components of Printed-Circuit-Board (PCB) and mismatch in passgate capacitance due to size dissimilarity between the NMOS and PMOS are key offenders that cause overshoot voltage.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

The present disclosure aims to overcome the drawbacks identified in the background section.

This present application proposes a gate driver control scheme to control a passgate switch so that no-overshoot will be observed at the output during switching. An improved Gate Driver Control is proposed that includes a Pass Gate Charge-Injector. The Gate Driver Control may further include an Input Voltage Sensing Timer. The Gate Driver Control may further include an Output Voltage Sensing Timer. This solution of the present disclosure enables fast switching of the passgate while achieving no-overshoot across wide-supply-voltage range while consuming no active current.

According to an aspect of the present disclosure, a Passgate Gate-Driver Control system is presented. The Passgate Gate-Driver Control system may include a Gate-Driver Control. The Passgate Gate-Driver Control system may further include a passgate switch comprising a PMOS transistor and an NMOS transistor. The Gate-Driver Control may include a Pass Gate Charge-Injector arranged to alter a charging speed and/or a discharging speed of an electrical charge at a gate of the PMOS and/or NMOS transistor.

In an embodiment, the Passgate Gate-Driver Control system may include two passgate switches each driven by a separate Gate-Driver Control.

In an embodiment, a first Gate-Driver Control may linearly control a switching ON and OFF state of a first passgate switch. A second Gate-Driver Control may linearly control a switching ON and OFF state of a second passgate switch.

According to an aspect the present disclosure, a Gate-Driver Control is presented. The Gate-Driver Control may be a part of the Passgate Gate-Driver Control system having one or more of the above-described features. The Gate-Driver Control Gate-Driver Control may include a Pass Gate Charge-Injector arranged to alter a charging speed and/or a discharging speed of an electrical charge at a gate of a PMOS and/or NMOS transistor of a passgate switch.

In an embodiment, the Gate-Driver Control may further include an Input Voltage Sensing Timer arranged to provide a first ONE-SHOT signal to the Pass Gate Charge-Injector for speeding up a turning ON of the passgate switch for a time duration. The time duration may be determined by an input voltage through the Input Voltage Sensing Timer.

In an embodiment, the Gate-Driver Control may further include an Output Voltage Sensing Timer arranged to provide a second ONE-SHOT signal to the Pass Gate Charge-Injector to enforce a slowing down of the speeding up of the turning ON of the passgate switch after speeding up the turning ON of the passgate switch for the time duration.

According to an aspect of the present disclosure, a Pass Gate Charge-Injector is presented. The Pass Gate Charge-Injector may be a part of a Gate-Driver Control having one or more of the above described features. The Pass Gate Charge-Injector may be arranged to alter a charging speed and/or a discharging speed of an electrical charge at a gate of a PMOS and/or NMOS transistor of a passgate switch.

In an embodiment, the Pass Gate Charge-Injector may be arranged to receive a first ONE-SHOT signal from an Input Voltage Sensing Timer of the Gate-Driver Control for speeding up a turning ON of the passgate switch for a time duration. The time duration may be determined by an input voltage through the Input Voltage Sensing Timer.

In an embodiment, the Pass Gate Charge-Injector may be arranged to receive a second ONE-SHOT signal from an Output Voltage Sensing Timer of the Gate-Driver Control to enforce a slowing down of the speeding up of the turning ON of the passgate switch after speeding up the turning ON of the passgate switch for the time duration.

According to an aspect of the present disclosure, an Input Voltage Sensing Timer is presented for a Passgate Gate-Driver Control system having one or more of the above described features. The Input Voltage Sensing Timer may be arranged to provide a first ONE-SHOT signal to a Pass Gate Charge-Injector for speeding up a turning ON of a passgate switch of the Passgate Gate-Driver Control system for a time duration. The time duration may be determined by an input voltage through the Input Voltage Sensing Timer.

BRIEF DESCRIPTION OF THE DRAWINGS

Embodiments of the present disclosure will now be described, by way of example only, with reference to the accompanying schematic drawings in which corresponding reference symbol indicate corresponding parts, in which.

Figure 1:
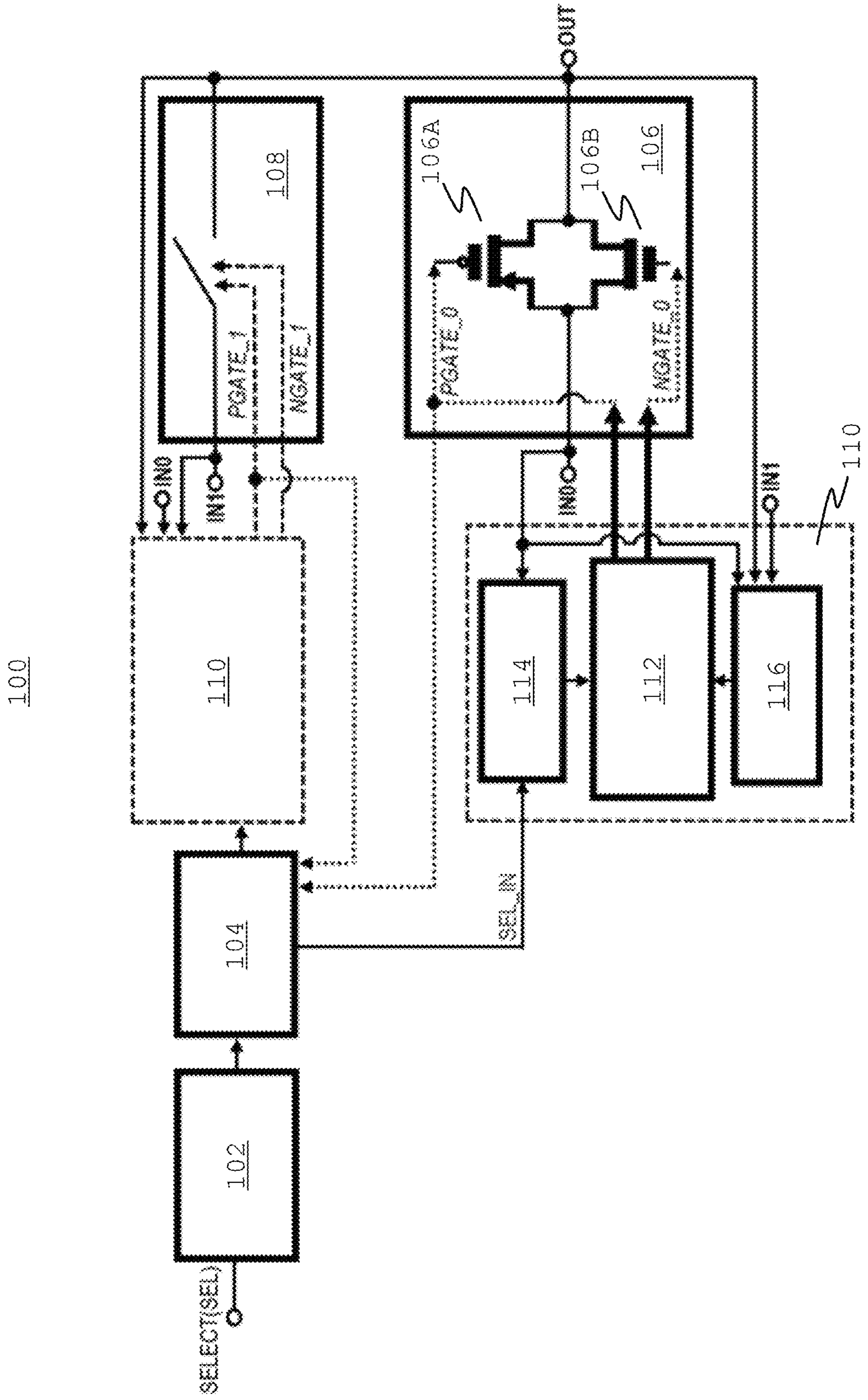
FIG. 1 shows an example Passgate Gate-Driver Control system architecture for no-overshoot when switching a passgate, according to an aspect of the present disclosure.

The figures are intended for illustrative purposes only, and do not serve as restriction of the scope of the protection as laid down by the claims.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same example.

Furthermore, the described features, advantages, and characteristics of the present disclosure may be combined in any suitable manner in one or more embodiments. One skilled in the relevant art will recognize, in light of the description herein, that the present disclosure may be practiced without one or more of the specific features or advantages of a particular embodiment. In other instances, additional features and advantages may be recognized in certain embodiments that may not be present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

As described in the background, overshoot and undershoot voltage during switching passgate switches can be damaging. Overshoot voltage can be manifested as voltage ringing during switching. Lowering the slew rate of the gate voltage during switching mitigates the overshoot but reduces the switching transition time, slowing down the system. Limitation of low-supply current and requirement for large supply variation from, e.g., 1.08 to 5.5V are key challenges to overcome.

To overcome the problems of having overshoot voltage at the OUTPUT, the present disclosure presents an electrical mechanism to create a "fast-start, slow-after" response which can speed up the transition time in a linear fashion. The solution of the present disclosure includes a new gate driver control system to generate such response. As will be explained in more detail below, the Gate Driver Control takes in signals from various pins sources such as the SELECT pin, INPUT and OUTPUT nets. These signals may then regulate the Pass Gate Charge-Injector to speed-up or slow-down the electrical charging and discharging of the passgate switch to control the overshoot and undershoot phenomena. In addition, the electrical mechanism does not have any active current while being adaptable to supply, input voltage and output voltage variation.

The solution of the present disclosure advantageously enables a low-power, wide-supply passgate switch gate-driver control for "fast-start, slow-after" response to prevent no-overshoot when switching.

FIG. 1 shows a Passgate Gate-Driver Control system architecture 100 of an example embodiment of the present disclosure. The system 100 may include an Input Control Logic 102, a Break-before-make circuit 104, two passgate switches 106, 108, hereinafter also referred to as passgate switch 0 (106) and passgate switch 1 (108). The two passgate switches 106, 108 are typically similar or identical in internal design. The system 100 may further include two Gate-Driver Controls 110, one for each passgate switch 106, 108. Signal lines between the elements of the system 100. Labels along the lines and arrows indicate various signals.

In an embodiment of the present disclosure, the Gate-Driver Control 110 includes a Pass Gate Charge-Injector 112, an Input Voltage Sensing Timer 114 and an Output Voltage Sensing Timer 116, which will be further explained below.

The proposed Passgate Gate-Driver Control system architecture 100 enables No-overshoot when switching passgates 106, 108.

The overall function of the proposed gate driver (i.e., Passgate Gate-Driver Control 110) is to linearly control the switching ON and OFF state of the passgate switches 106, 108, which are the passgate switch 0 (106) and passgate switch 1 (108) in FIG. 1. The Pass Gate Charge-Injector 112 may alter the charging and discharging speed of electrical charge to the gate of the NMOS 106B and PMOS 106A transistors of the passgate switch 106, 108 during switching.

The control mechanism of the Pass Gate Charge-Injector 112 may depend on gate control signals from the Input Voltage Sensing Timer 114 and Output Voltage Sensing Timer 116 to achieve a "fast-start, slow-after" response. The Voltage Sensing Elements 114, 116 ensure accurate timing sequencing of the charging and discharge speed of electrical charge to the gates of the passgate switch 106, 108. The "fast-rising, slow-after" response alleviate the voltage overshoot and undershoot during the switching passgate switches 106, 108 while achieving fast switching transition time from one passgate switch to the other.

Advantageously, the system 100 and in particular the implementation of the gate driver control as Passgate Gate-Driver Control 110 of the present disclosure ensures adaptability to wide-supply voltages while consuming substantially no direct current (DC).

Figure 2:
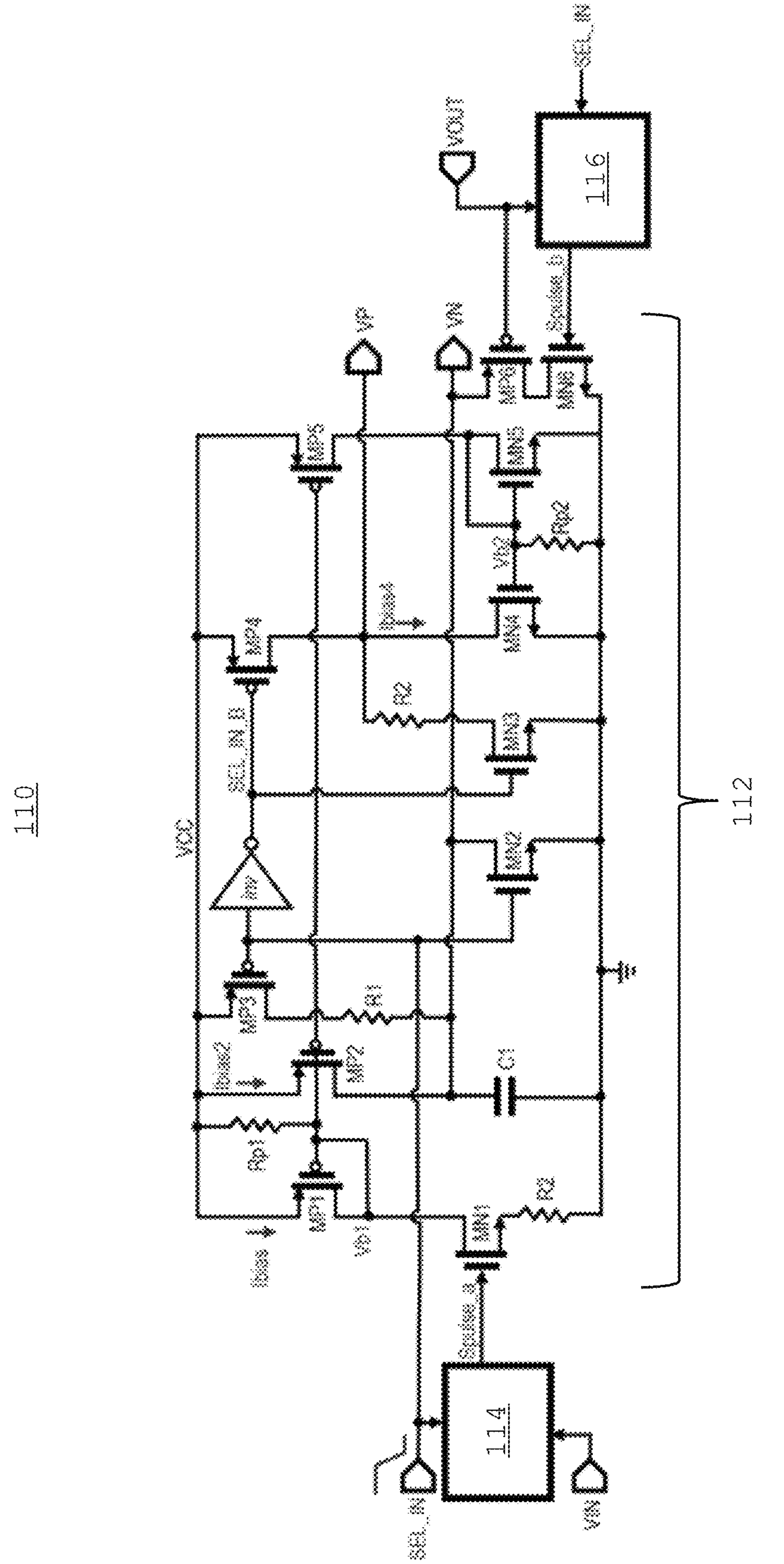
FIG. 2 shows an example Gate Driver Control Circuit schematic, according to an aspect of the present disclosure.

FIG. 2 shows a schematic of a complete top-level Gate-Driver Control circuit 110 of an example embodiment of the present disclosure. The "fast-rising, slow-after" response are reflected at net VN and VP. The output nets VN and VP drives the NMOS gate and PMOS gate of the passgate switch 106, 108, respectively. A passgate switch 106, 108 is selected to turn ON when the SEL_IN signal is in a HIGH state. Therefore, devices MN2 and MP4 are ON during the initial state when SEL_IN is HIGH with VN and VP voltage being LOW and HIGH, respectively.

As SEL_IN goes from HIGH-to-LOW, MN2 and MP4 turns OFF, MN3 and MP3 turns ON. At the same time during the transition state, MN1 is triggered with a ONE-SHOT signal, Spulse_a. As MN1 is turned-ON, net Vb1 will be pulled to ground and MP1, MP2, MP5 and MN4 will be turned-ON which generate a bias current, Ibias through this network circuit. This bias network will first dominate MN3 and MP3 during the turning-ON transition state. The activated Ibias through MP1 is mirrored to MP2 and MN4 as Ibias2 and Ibias4, respectively. MP2 and MP4 quickly injects large electrical charge to the NMOS and PMOS gate, respectively. Consequently, a "fast-rising" response will be observed at VN and VP where the voltage VN goes quickly from LOW-to-HIGH and VP from HIGH-to-LOW.

The ONE-SHOT of Spulse_a through MP1, MP2, MP5 and MN4 is to speed up the turning ON of the passgate switch for a short duration. The duration of Spulse_a will be determined by the input voltage, VIN through the Input Voltage Sensing Timer 114. This is to ensures the right amount of charge is injected as to not cause overshoot at the output but still retain a fast turning-ON time. Once the ONE-SHOT signal ends, the Gate Driver Control will start to slow down turning-ON of the passgate switch 106, 108 through MN3 and MP3 turns ON. The RC elements R1 with C1 and R2 purpose is to slow down the rising and falling voltage of VN and VP, respectively during the transition time of turning ON passgate switch 106, 108. The "slow-after" response is further enforced with the Output Voltage Sensing Timer circuit 116. The output voltage, VOUT is detected through the biasing MP6 when the voltage is below one Vth below the supply voltage and the Output Voltage Sensing Timer 116. The Output Voltage Sensing Timer 116 would activate and generate a ONE-SHOT signal, Spulse_b to turn-ON this network and further enforce a "slow-after" response. When the voltage at VN and VP settles and the passgate switch is ON, MN3 and MP3 are the primary pull-down device for net VP and pull-up device for net VN, respectively. This network branch will be ON throughout the turning ON time of the passgate switch.

Figure 3:
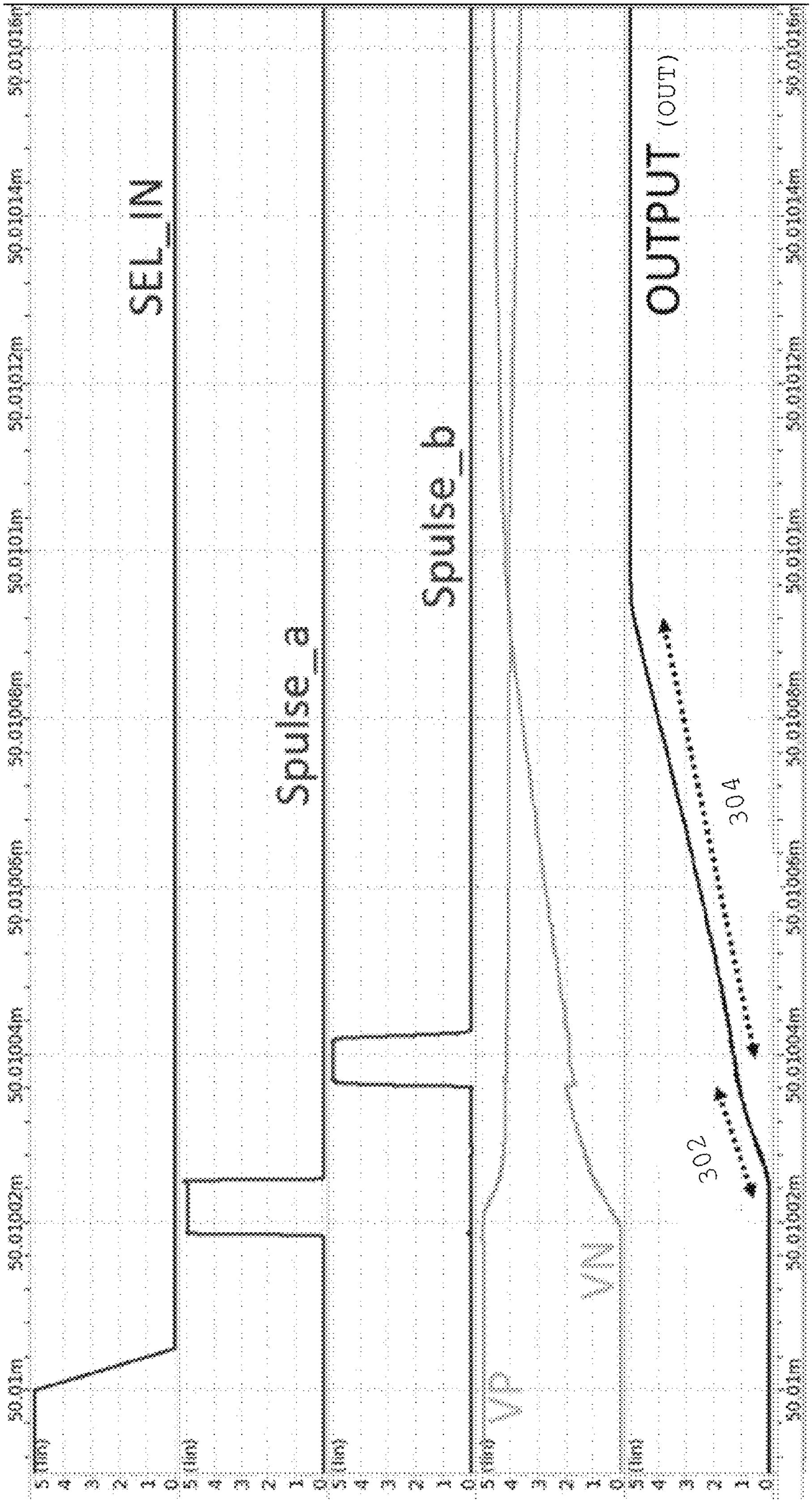
FIG. 3 shows graphs of example node voltages responses during system activation.

FIG. 3 shows graphs of various node voltages responses 300 during system activation. The x-axes represents time (in milliseconds) and the Y-axes represent voltages between 0V and 5V. From top to bottom, the SEL_IN signal, the Spulse_a output signal from the Input Voltage Sensing Timer 114, the Spulse_b output signal from the Output Voltage Sensing Timer 116, VP and VN, and the OUTPUT signal (OUT in FIG. 1) of the passgate switch 106, 108.

As can be seen, the OUTPUT plot exhibit a "fast-start, slow-after" response to prevent no-overshoot during switching (the fast-start is depicted 302; the slow-after is depicted 304). VP and VN shows the gate voltage of the passgate switch 106, 108 which are controlled by the Gate-Driver Control 110. When the Gate-Driver Control 110 is activated through SEL_IN going from High-to-LOW, we can observe the ONE_SHOT signals, Spulse_a and subsequently Spulse_b activating.

Figure 4:
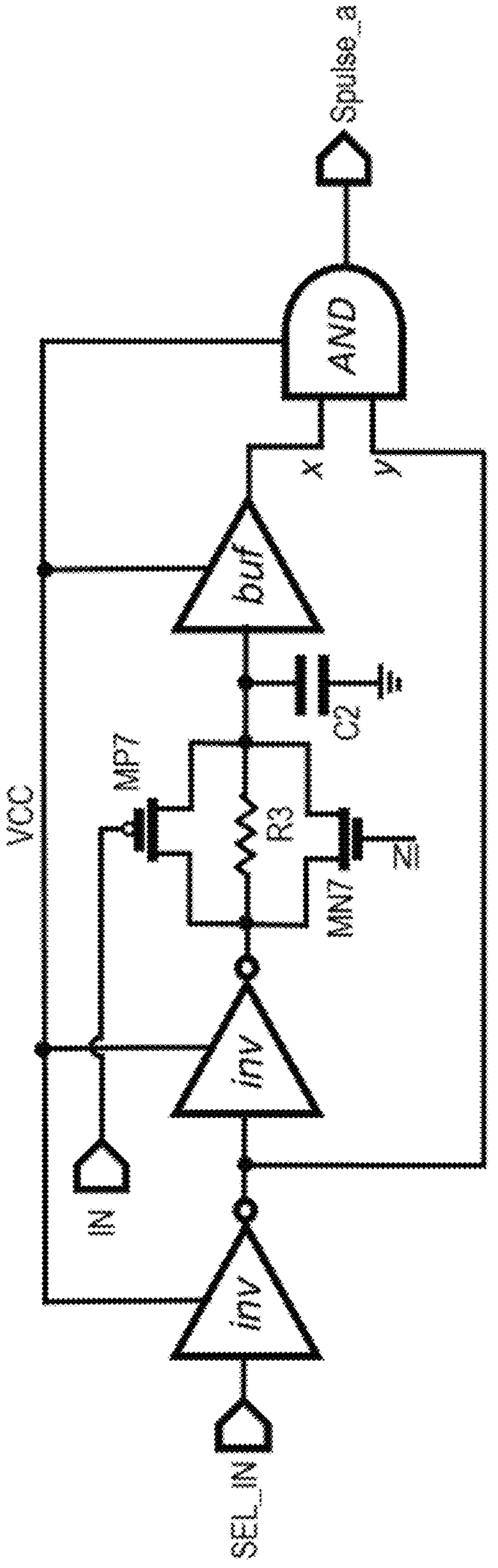
FIG. 4 shows an example Input Voltage Sensing Timer schematic, according to an aspect of the present disclosure.

The pulse width of the ONE-SHOT signal, Spulse_a, may be determined by the voltage level of VIN through the Input Voltage Sensing Timer 114, such as shown in the example embodiment of FIG. 4. The circuit of the Input Voltage Sensing Timer 114 may ensure that the ONE-SHOT duration is properly timed for the "fast-start". The voltage at the input provides information to the Input Voltage Sensing Timer 114 to alter the pulse width of the ONE-SHOT through MP7, MN7, R3 and C2. The equivalent resistor of MP7, MN7 and R3 will be dictated by the INPUT voltage to alter the time of the ONE-SHOT duration. The ONE-SHOT signal is generated when SEL_IN goes from HIGH-to-LOW. At steady-state when SEL_IN is either HIGH or LOW, Spulse_a would be LOW as shown in Table 1.

TABLE 1

Input Voltage Sensing Timer Truth Table

| SEL_IN | x | y | Spulse_a |
|---|---|---|---|
| 0 | 0 | 1 | 0 |
| 1 | 1 | 0 | 0 |

Figure 5:
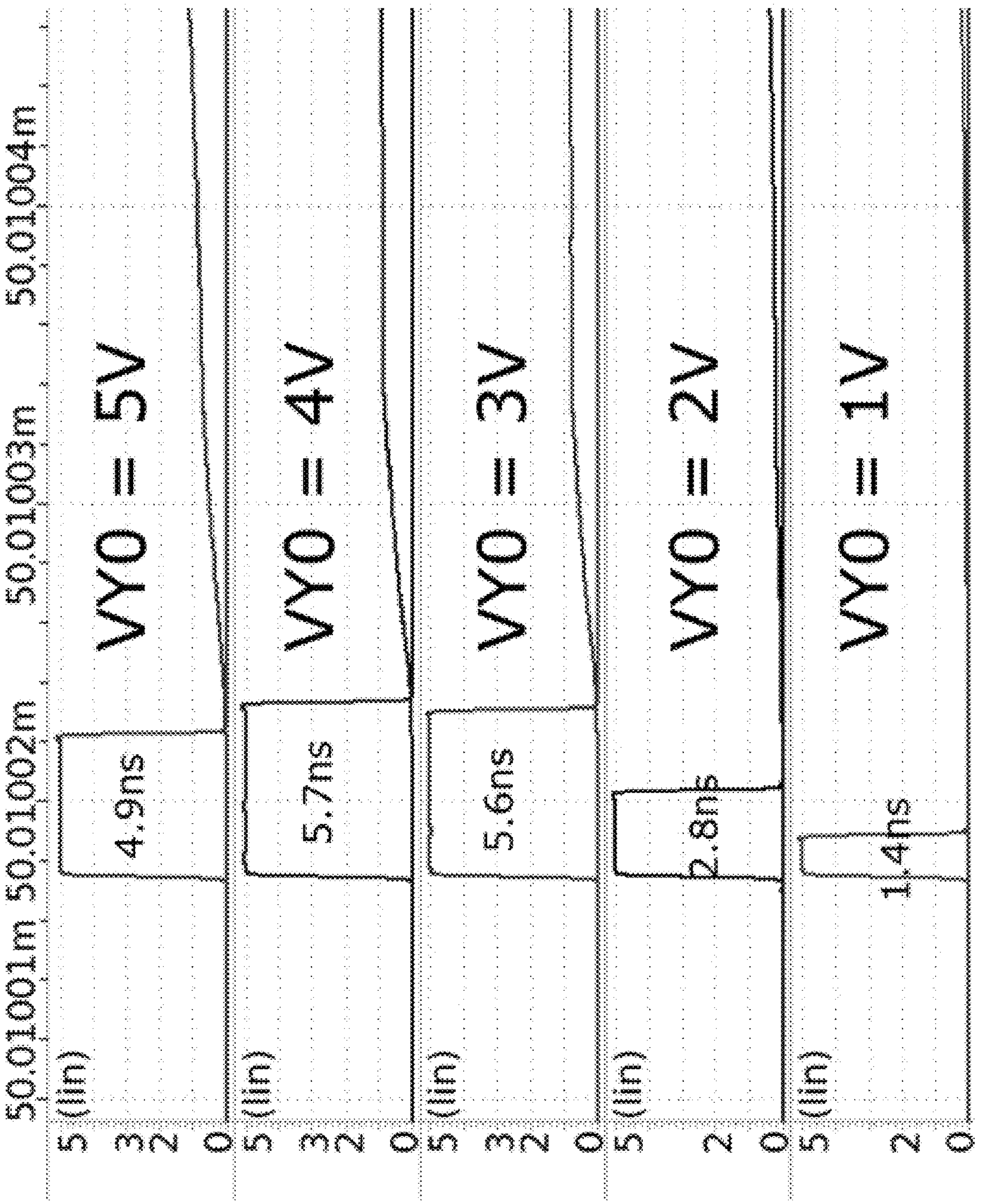
FIG. 5 shows graphs of example One Shot Pulse Duration Tracking with Input.

The ONE-SHOT Spulse_a is generated when node x and y are both HIGH momentarily as shown in Table 2. FIG. 5 shows an example of the pulse width varying with the detected INPUT voltage. Longer pulse width may be required when the input voltage is higher as more time is needed for the OUTPUT voltage to rise. Shorter pulse may be required if the OUTPUT voltage does not need to rise too HIGH.

TABLE 2

AND gate truth table

| x | y | Spulse_a | SEL_IN State |
|---|---|---|---|
| 0 | 0 | 0 | LOW-to-HGIH |
| 1 | 0 | 0 | Static |

TABLE 2-continued

AND gate truth table

| x | y | Spulse_a | SEL_IN State |
|---|---|---|---|
| 0 | 1 | 0 | Static |
| 1 | 1 | 1 | HIGH-to-LOW |

Figure 6:
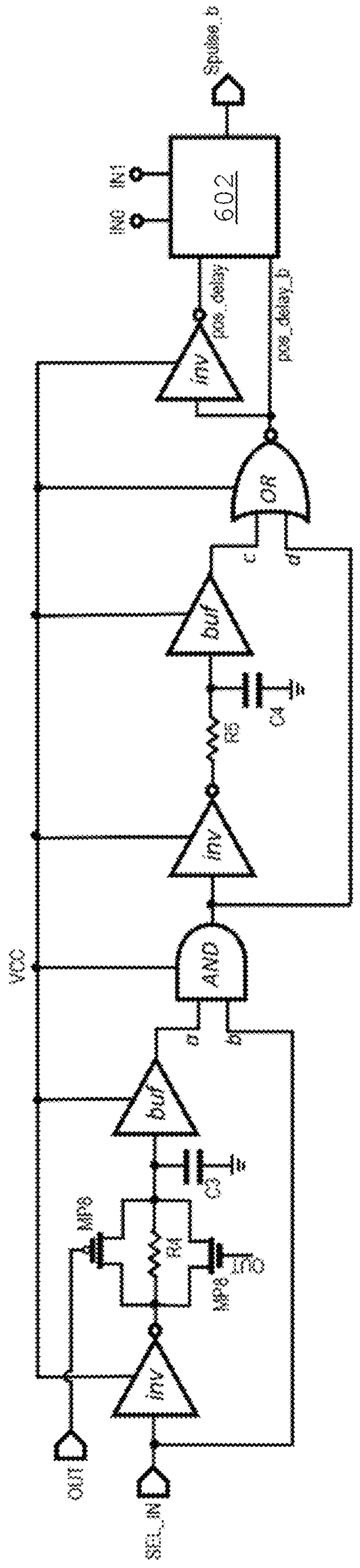
FIG. 6 shows an example Output Voltage Sensing Timer schematic, according to an aspect of the present disclosure.

The Spulse_b signal may be determined through the Output Voltage Sensing Timer 116, such as shown in the example embodiment of FIG. 6. In the example of FIG. 6, Spulse_b will only be generated when VOUT is below Vth. This is to detect the OUTPUT voltage for the Gate Driver to know at what voltage the passgate switch 106, 108 is rising from. Like the Input Voltage Sensing Timer 114, the ONE-SHOT delay element MP8, MN8 and R4 and C3 dictate the width of Spulse_b. The equivalent resistance of MP8, MN8 and R4 is dictated by the output voltage. Thus, with this gate control mechanism, a fast-switching time with no-overshoot voltage at the output can be achieved during the switching of the passgate switch 106, 108. In addition, the "slow-after" response is further enforced through the Output Voltage Sensing Timer 116.

Figure 7:
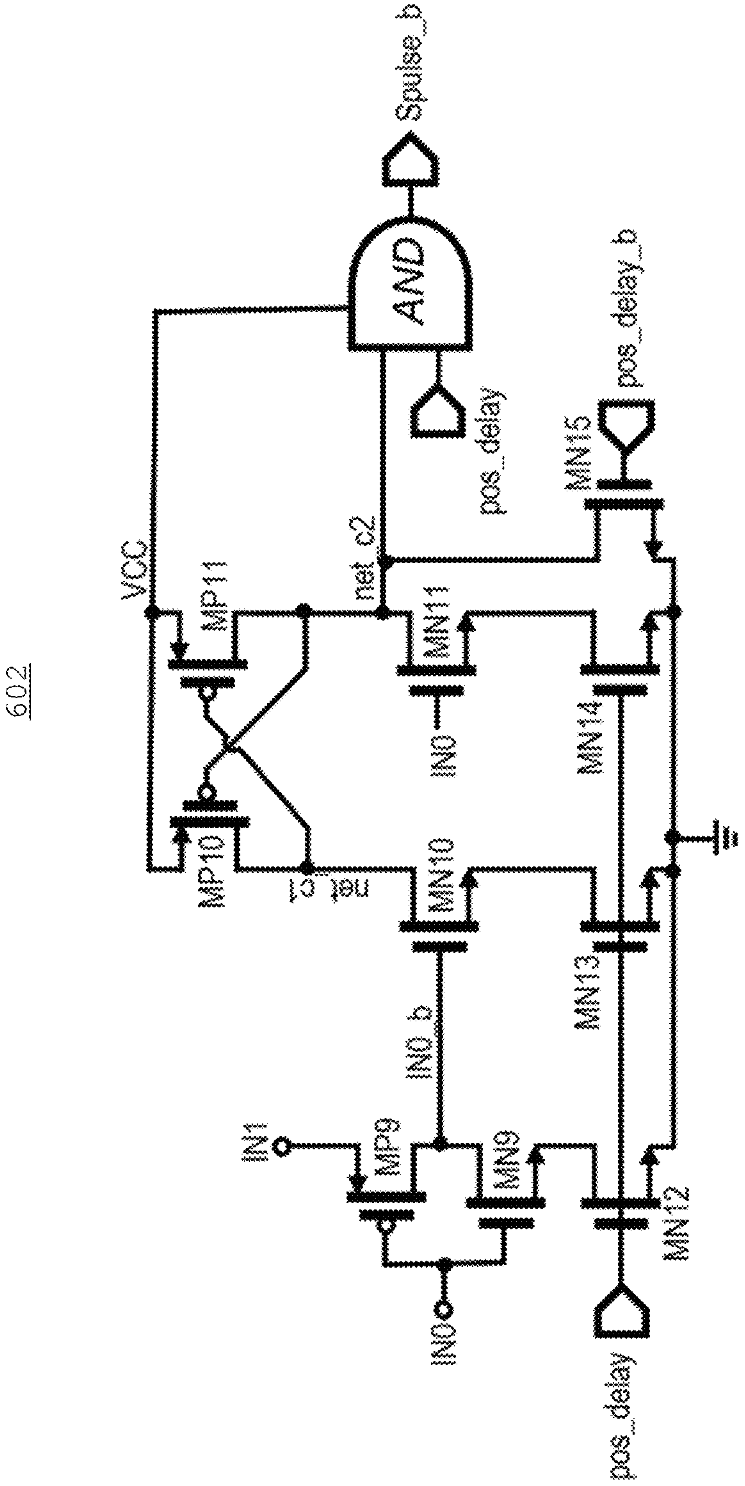
FIG. 7 shows an example Comparator Circuit of an Output Voltage Sensing Timer, according to an aspect of the present disclosure.

To further enhance the Output Voltage Sensing Timer 116, a comparator 602 may be used as a bypass mechanism to deactivate Spulse_b. This occurs when IN0 and IN1 are both in a HIGH-state. An example embodiment of comparator 602 is shown in FIG. 7 with its example implementation for the Gate-Driver Control circuit 110 that regulate the passgate switch 0 (106) in FIG. 1. When the voltages at net IN0 and IN1 are both HIGH of at least one Vth, net_c1 and net_c2 would be HIGH and LOW, respectively. The state of net_c1 and net_c2 are set through level shifter (MP10, MP11, MN10, MN11) and MP9 and MN9. During this time, the AND-gate would deactivate the second ONE-SHOT signal to the Pass Gate Charge-Injector 112 by the Output Voltage Sensing Timer 116 not to propagate to Spulse_b. When IN0 is LOW and IN1 is HIGH, IN0_*b* would be HIGH. Therefore, net_c1 and net_c2 would be LOW and HIGH respectively, allowing the ONE-SHOT signal from the Output Voltage Sensing Timer 116 to the Pass Gate Charge-Injector 112 to better reinforce the "slow-after" state and prevent overshot at the OUTPUT during switching.

Figure 8:
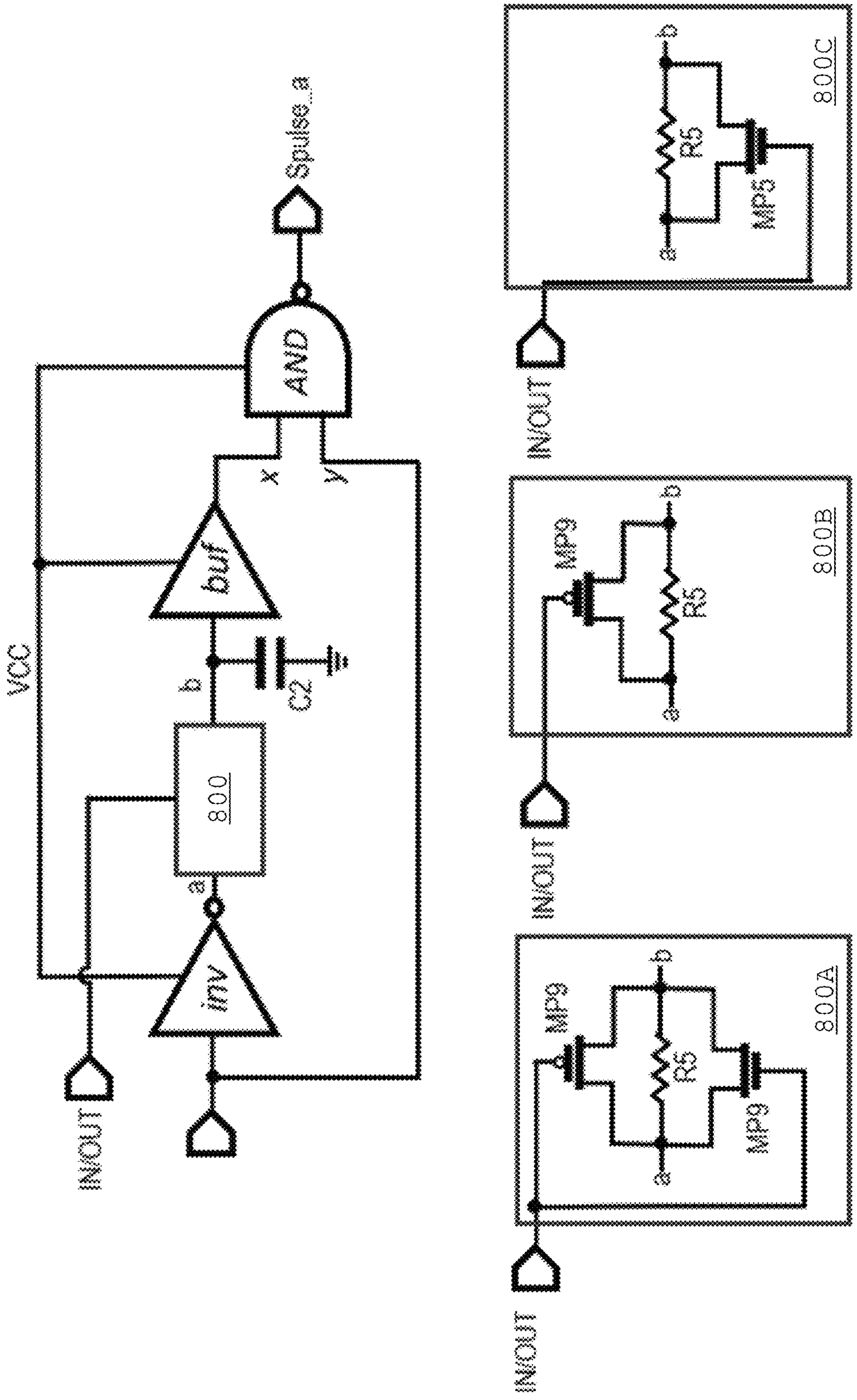
FIG. 8 shows various, non-limiting examples of equivalent resistor elements of an Input and Output sensing voltage timer.

The Input Voltage Sensing Time 114 and the Output Voltage Sensing Timer 116 may each include an equivalent resistor element 800, such as shown in FIG. 8. The equivalent resistor element 800 may be implemented in various manners, such as shown in the variants 800A, 800B and 800C of the equivalent resistor element 800.

The solution of the present disclosure advantageously enables a wide-supply and input/output voltage range. The supply may, e.g., be in a range from 1.08V to 5.5V. The OUTPUT range may, e.g., be in a range from 0V to 5.5V.

The solution of the present disclosure advantageously allows a low supply current. The Gate-Driver Control 110 does not require any active circuit that consumes current.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

The invention claimed is:

1. A Passgate Gate-Driver Control system comprising:
a Gate-Driver Control; and
a passgate switch comprising a P-channel Metal-Oxide-Semiconductor (PMOS), transistor and an N-channel Metal-Oxide-Semiconductor (NMOS), transistor;
wherein the Gate-Driver Control comprises;
a Pass Gate Charge-Injector arranged to alter a charging speed and/or a discharging speed of an electrical charge at a gate of the PMOS and/or a NMOS transistor; and
an Input Voltage Sensing Timer arranged to provide a first ONE-SHOT signal (Spulse_a) to the Pass Gate Charge-Injector for speeding up a turning ON of the passgate switch for a time duration; and/or
an Output Voltage Sensing Timer arranged to provide a second ONE-SHOT signal (Spulse_b) to the Pass Gate Charge-Injector to enforce a slowing down of the speeding up of the turning ON of the passgate switch after speeding up the turning ON of the passgate switch for the time duration.

2. The Passgate Gate-Driver Control system according to claim 1, further comprising two passgate switches each driven by a separate Gate-Driver Control.

3. The Passgate Gate-Driver Control system according to claim 2, further comprising a first Gate-Driver Control that linearly controls a switching ON and OFF state of a first passgate switch and a second Gate-Driver Control that linearly controls a switching ON and OFF state of a second passgate switch.

4. An Input Voltage Sensing Timer for a Passgate Gate-Driver Control system according to claim 3,
wherein the Input Voltage Sensing Timer is arranged to provide the first ONE-SHOT signal (Spulse_a) to the Pass Gate Charge-Injector for speeding up a turning ON of a passgate switch of the Passgate Gate-Driver Control system for a time duration; and
wherein the time duration is determined by an input voltage (VIN) through the Input Voltage Sensing Timer.

5. An Input Voltage Sensing Timer for a Passgate Gate-Driver Control system according to claim 2,
wherein the Input Voltage Sensing Timer is arranged to provide the first ONE-SHOT signal (Spulse_a) to a Pass Gate Charge-Injector for speeding up a turning ON of a passgate switch of the Passgate Gate-Driver Control system for the time duration; and
wherein the time duration is determined by an input voltage (VIN) through the Input Voltage Sensing Timer.

6. The Passgate Gate-Driver Control system according to claim 1, wherein the Gate-Driver Control further comprises:
the Input Voltage Sensing Timer arranged to provide the first ONE-SHOT signal (Spulse_a) to the Pass Gate Charge-Injector for speeding up a turning ON of the passgate switch for a time duration; and
wherein the time duration is determined by an input voltage (VIN) through the Input Voltage Sensing Timer.

7. The Passgate Gate-Driver Control system according to claim 1, wherein the Gate-Driver Control further comprises:
the Output Voltage Sensing Timer arranged to provide the second ONE-SHOT signal (Spulse_b) to the Pass Gate Charge-Injector to enforce a slowing down of the speeding up of the turning ON of the passgate switch after speeding up the turning ON of the passgate switch for the time duration.

8. A Gate-Driver Control for a Passgate Gate-Driver Control system according to claim 1, wherein the Gate-Driver Control comprises a Pass Gate Charge-Injector arranged to alter a charging speed and/or a discharging speed of an electrical charge at a gate of a PMOS and/or NMOS transistor of a passgate switch.

9. The Gate-Driver Control according to claim 8, further comprising:

the Input Voltage Sensing Timer arranged to provide a first ONE-SHOT signal (Spulse_a) to the Pass Gate Charge-Injector for speeding up the turning ON of the passgate switch for a time duration; and wherein the time duration is determined by an input voltage (VIN) through the Input Voltage Sensing Timer.

10. The Gate-Driver Control according to claim 9, further comprising:

an Output Voltage Sensing Timer arranged to provide the second ONE-SHOT signal (Spulse_b) to the Pass Gate Charge-Injector to enforce a slowing down of the speeding up of the turning ON of the passgate switch after speeding up the turning ON of the passgate switch for the time duration.

11. The Gate-Driver Control according to claim 8, further comprising:

the Output Voltage Sensing Timer arranged to provide the second ONE-SHOT signal (Spulse_b) to the Pass Gate Charge-Injector to enforce a slowing down of the speeding up of the turning ON of the passgate switch after speeding up the turning ON of the passgate switch for the time duration.

12. A Pass Gate Charge-Injector for a Gate-Driver Control according to claim 8, wherein the Pass Gate Charge-Injector is arranged to alter a charging speed and/or a discharging speed of an electrical charge at a gate of a PMOS and/or NMOS transistor of a passgate switch.

13. The Pass Gate Charge-Injector according to claim 12, wherein the Pass Gate Charge-Injector is arranged to receive the first ONE-SHOT signal (Spulse_a) from an Input Voltage Sensing Timer of the Gate-Driver Control for speeding up the turning ON of the passgate switch for a time duration; and wherein the time duration is determined by an input voltage (VIN) through the Input Voltage Sensing Timer.

14. The Pass Gate Charge-Injector according to claim 13, wherein the Pass Gate Charge-Injector is arranged to receive the second ONE-SHOT signal (Spulse_b) from an Output Voltage Sensing Timer of the Gate-Driver Control to enforce a slowing down of the speeding up of the turning ON of the passgate switch after speeding up the turning ON of the passgate switch for the time duration.

15. The Pass Gate Charge-Injector according to claim 12, wherein the Pass Gate Charge-Injector is arranged to receive the second ONE-SHOT signal (Spulse_b) from an Output Voltage Sensing Timer of the Gate-Driver Control to enforce a slowing down of the speeding up of the turning ON of the passgate switch after speeding up the turning ON of the passgate switch for the time duration.

16. An Input Voltage Sensing Timer for a Passgate Gate-Driver Control system according to claim 1, wherein the Input Voltage Sensing Timer is arranged to provide the first ONE-SHOT signal (Spulse_a) to a Pass Gate Charge-Injector for speeding up a turning ON of the passgate switch of the Passgate Gate-Driver Control system for a time duration; and wherein the time duration is determined by an input voltage (VIN) through the Input Voltage Sensing Timer.

17. A Passgate Gate-Driver Control system comprising:

a Gate-Driver Control; and a passgate switch comprising a P-channel Metal-Oxide-Semiconductor (PMOS), transistor and an N-channel Metal-Oxide-Semiconductor (NMOS), transistor;

wherein the Gate-Driver Control comprises:

a Pass Gate Charge-Injector arranged to alter a charging speed and a discharging speed of an electrical charge at a gate of the PMOS and a NMOS transistor;

an Input Voltage Sensing Timer arranged to provide a first ONE-SHOT signal (Spulse_a) to the Pass Gate Charge-Injector for speeding up a turning ON of the passgate switch for a time duration; and/or an Output Voltage Sensing Timer arranged to provide a second ONE-SHOT signal (Spulse_b) to the Pass Gate Charge-Injector to enforce a slowing down of the speeding up of the turning ON of the passgate switch after speeding up the turning ON of the passgate switch for the time duration.

* * * * *